(12) United States Patent
Ozawa

(10) Patent No.: US 6,535,421 B1
(45) Date of Patent: Mar. 18, 2003

(54) NONVOLATILE SEMICONDUCTOR MEMORY HAVING A VOLTAGE SELECTION CIRCUIT

(75) Inventor: Takanori Ozawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/500,385

(22) Filed: Feb. 8, 2000

(30) Foreign Application Priority Data

Feb. 10, 1999 (JP) .......................................... 11-033434

(51) Int. Cl.$^7$ .............................................. G11C 29/00
(52) U.S. Cl. ............................ 365/185.09; 365/189.09; 365/201; 365/227; 365/228; 365/226; 365/185.09
(58) Field of Search ................................ 365/226, 227, 365/228, 229, 189.09, 145, 201, 189.11, 185.09

(56) References Cited

U.S. PATENT DOCUMENTS

| | | | | |
|---|---|---|---|---|
| 5,309,399 A | * | 5/1994 | Murotani | 365/189.09 |
| 5,337,279 A | * | 8/1994 | Gregory et al. | 365/201 |
| 5,903,501 A | * | 5/1999 | Kurosaki | 365/189.05 |
| 5,963,490 A | * | 10/1999 | Kawamura | 365/201 |
| 5,991,189 A | * | 11/1999 | Miwa | 365/145 |
| 6,031,755 A | * | 2/2000 | Ozawa | 365/145 |
| 6,046,926 A | * | 4/2000 | Tanaka et al. | 365/145 |
| 6,069,817 A | * | 5/2000 | Shin et al. | 365/145 |
| 6,088,820 A | * | 7/2000 | Jyo et al. | 714/718 |

* cited by examiner

Primary Examiner—Andrew Q. Tran
(74) Attorney, Agent, or Firm—Hogan & Hartson, LLP

(57) ABSTRACT

A nonvolatile semiconductor memory which includes a voltage supply terminal, a multiplicity of memory cells, a voltage selection circuit, and a voltage dropping circuit. The terminal receives a supply voltage from an external voltage source. The voltage selection circuit is coupled to the terminal for selectively outputting a first and a second voltage to be supplied to the memory cells. The voltage dropping circuit is coupled between the voltage selection circuit and the memory cells for dropping the second voltage output from the voltage selection circuit before it is input to the memory cells.

26 Claims, 3 Drawing Sheets

NONVOLATILE SEMICONDUCTOR MEMORY HAVING A VOLTAGE SELECTION CIRCUIT

FIELD OF THE INVENTION

The invention relates to a nonvolatile semiconductor memory having memory cells, such as a ferroelectric memory.

BACKGROUND OF THE INVENTION

Nonvolatile semiconductor memories such as a ferroelectric memory and a flash memory exhibit unstable behaviors and can write erroneous data or often fails to write data when the supply voltage to the memory lowers below a certain limit, due to consumption of the cell for example. In order to prevent such anomaly, these memories are provided with a detection circuit for detecting the level of the supply voltage and disenabling the memories when the level is below a predetermined voltage.

For example, a detection circuit 50 as shown in FIG. 1(a) monitors the voltage at node P where the voltage is equal to a supply voltage Vcc multiplied by a ratio R2/(R1+R2). When the supply voltage Vcc lowers below the predetermined level, the detection circuit 50 sends a control signal to memory cells 51 and a logic circuit 52 via dotted signal lines as shown in FIG. 1(a). Upon receipt of the control signal, the memory cells 51 and the logic circuit 52 are disenabled. Such disenablement is called low-voltage lockout, and the predetermined level, lockout voltage.

In order to secure operational reliability of a nonvolatile semiconductor memory, the lockout voltage is set at a higher level B above the lowest operable voltage A, leaving a certain margin B–A above the voltage A as shown in FIG. 1(b). Thus, the allowable voltage range for the memory is the range B–C between the level B and the normal supply voltage C. Therefore, as seen from FIG. 1(b), range A–C is the maximum operable range, range O–A is the inoperable range, range O–B is the lockout range in which the memory cells 51 or the logic circuit 52 are not provided with the supply voltage.

In order to reduce the failure rate of nonvolatile memories during the working life, they are screened under harsh conditions such as a severe thermal stress, to thereby remove defective products. FIG. 2 is a graphical representation of a failure rate h(t) as a function of time for a semiconductor memory, in which region O–D is an initial error-liable period where most defects can be found in screening, period D–E is the use period (i.e. period that the memory can be used reliably and can be put on market). Point E is the end of the life of a memory. Unlike flash memories which manifest defects at an early stage of such screening if they are defective, ferroelectric memories are likely to manifest defects throughout their working life period, as shown in FIG. 2.

Therefore, in order to perform sufficient screening of products to a degree that the products are reliable throughout their working lives, it must be performed over a very long period of time, which, however, disadvantageously shorten their working lives and reduce the overall reliability of a device that uses the over-tested memories.

However, a quicker screening can be done, especially for ferroelectric memories, by lowering the screening voltage, since operating conditions for ferroelectric memories become severer at a lower operating voltage. It is noted in FIG. 2 that if screening can be attained up to point F in the working period by lowering the screening voltage below a normal screening voltage (5 Volts for example), one may virtually attain full screening, or the screening over the entire working life up to point E, by performing the screening at a level (3 Volts for example) which is exceedingly lower than the normal screening voltage.

However, as mentioned above, in order to ensure stable operation of a semiconductor memory like a ferroelectric memory and a flash memory, the low-voltage lockout mechanism will be activated when the supply voltage lowers below the lockout voltage, although the supply voltage is still within the allowable operable range B–C. Hence, because of this fixed lockout voltage, the screening voltage cannot be dropped below level B, the lower limit of the operative range B–C. Therefore, sufficient screening is prohibited. On the other hand, it is not recommended to reduce the lower limit B itself of the nominal operative range, since then a chance of erroneous memory write will increase during the working life, and the reliability of the memory will not be guaranteed.

The invention is directed to an improvement in a semiconductor memory, wherein the semiconductor memory can be tested for screening at a lower screening voltage than the preset lockout voltage of a low-voltage lockout mechanism thereof.

SUMMARY OF THE INVENTION

In one aspect of the invention, a nonvolatile semiconductor memory includes:
- a supply voltage terminal for receiving a supply voltage from an external source;
- a multiplicity of memory cells;
- voltage selection means coupled to the terminal for selectively outputting a first and a second voltage to be supplied to the memory cells; and
- voltage dropping means coupled between the voltage selection means and the memory cells for dropping the second voltage output from the voltage selection means before it is input to the memory cells.

The voltage selection means is controllable by an external control signal. The voltage selection means may provide the first and the second output voltages via a p-channel MOS transistor (referred to as PMOS transistor) and an n-channel MOS transistor (referred to as NMOS transistor), respectively, and may generate a control voltage for controlling the PMOS and NMOS transistors. Also, the voltage dropping means may comprise one NMOS transistor/diode or a multiplicity of NMOS transistors/diodes connected in series.

In another aspect of the invention, a nonvolatile semiconductor memory includes:
- a supply voltage terminal for receiving a supply voltage;
- a multiplicity of memory cells;
- voltage dropping means coupled to the terminal for dropping the supply voltage to a predetermined voltage; and
- voltage selection means coupled to the voltage dropping means and the terminal for selecting either the predetermined voltage or the supply voltage to be provided to the memory cells.

The voltage selection means may be controlled by an external control signal. The voltage selection means is adapted to selectively output the predetermined or the supply voltages via an NMOS transistor and a PMOS transistor, respectively, and generates a control voltage for controlling the transistors.

The voltage dropping means may comprise one NMOS transistor/diode or a multiplicity of NMOS transistors/diodes connected in series.

In this arrangement, a nonvolatile semiconductor memory of the invention may provide on one hand the supply voltage to memory controlling means such as logic circuits and an address control circuit, and provide on the other hand either the supply voltage or a dropped voltage derived therefrom to the memory cells. Accordingly, if a nonvolatile semiconductor memory has a low-voltage lockout mechanism, screening can be safely performed at a lower screening voltage than the lockout voltage.

This arrangement, therefore, permits quick and effective screening of a nonvolatile memory at a low voltage, which is also preferable for damage-free screening.

It is noted that the selection means is constructed using a PMOS and an NMOS transistors which can be switched on and off by an external control signal, thereby allowing easy selection of the screening voltage.

It is also noted that the voltage dropping means consists of an NMOS transistor or a multiplicity of NMOS transistors connected in series, which causes the supplied voltage to be dropped easily to a required level in cooperation with the NMOS transistor of the selection means.

In addition, a nonvolatile semiconductor memory of the invention may be operated at a lower voltage than its nominal operating voltage during the working life period, if desired, by simply switching the operating conditions of the selection means. That is, one may selectively apply a lower voltage to memory cells only but not to other elements. This helps protect the memory cells and extend the working life of the memory.

In a further aspect of the invention, a nonvolatile semiconductor memory includes:

at least one memory cell;

an internal voltage controller coupled to at least one voltage controller transistor wherein the internal voltage controller controls the at least one voltage controller transistor for selectively outputting a voltage to be supplied to the at least one memory cell; and at least two series-connected transistors coupled between the at least one voltage controller transistor and the at least one memory cell for dropping the voltage output from the at least one voltage controller transistor before it is input to the at least one memory cell.

The internal voltage controller may be controlled by an external control signal. The at least one voltage controller transistor may include at least one p-channel transistor and at least one n-channel transistor. Also, the internal voltage controller may generate a control voltage for controlling the at least one voltage controller transistor. In addition, the at least two series-connected transistors may include n-channel transistors.

In a further aspect of the invention, a nonvolatile semiconductor memory includes:

a supply voltage terminal for receiving a supply voltage;

at least one memory cell;

at least two series-connected transistors for dropping the supply voltage before it is input to the at least one memory cell, the at least two series-connected transistors coupled between the supply voltage terminal and the at least one memory cell; and at least one voltage controller transistor wherein each of the at least one voltage controller transistor is coupled between an internal voltage controller and one of the supply voltage terminal and the at least two series-connected transistors, wherein the internal voltage controller controls the at least one voltage controller transistor for selectively outputting a voltage to be supplied to the at least one memory cell.

As in the prior aspect of the invention, the internal voltage controller may be controlled by an external control signal. The at least one voltage controller transistor may include at least one p-channel transistor and at least one n-channel transistor. Also, the internal voltage controller may generate a control voltage for controlling the at least one voltage controller transistor. In addition, the at least two series-connected transistors may include n-channel transistors."

BRIEF DESCRIPTION OF THE DRAWINGS

The invention will now be described in detail by way of example with reference to accompanying drawings, in which.

DETAILED DESCRIPTION OF THE PREFERRED EMBODIMENT

Figure 3:
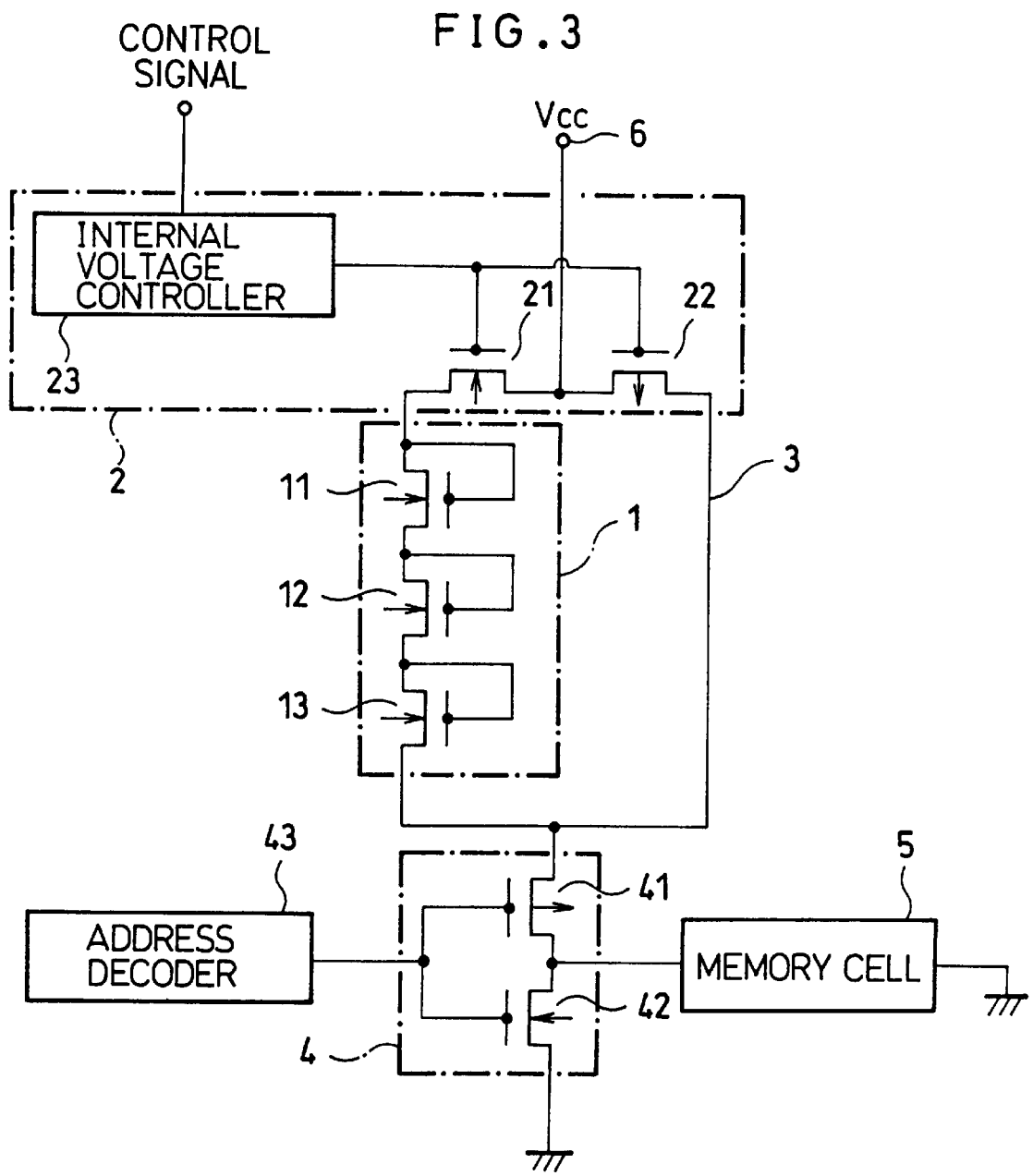
FIG. 3 is a block diagram of a nonvolatile semiconductor memory according to the invention.

Referring now to FIG. 3, there is shown in block diagram a nonvolatile semiconductor memory according to the invention. The memory comprises: a terminal (referred to as supply voltage terminal) 6 for supplying a supply voltage Vcc; memory cells 5 (of these only one cell is shown in FIG. 3 for simplicity); voltage dropping means 1 for dropping the voltage Vcc supplied from the terminal 6 to a predetermined level; and voltage selection means 2 connected with the voltage dropping means 1 to provide the dropped voltage to the memory cell 5 independently of the supply voltage Vcc. The voltage selection means 2 has an internal voltage controller 23, which can select either the supply voltage Vcc or the voltage dropped by the voltage dropping means 1 upon receipt of a control signal from an external device, and provide the selected voltage to the memory cell 5.

Although not shown in FIG. 3, the nonvolatile semiconductor memory includes memory controlling means such as logic circuits and address controlling circuits for reading and writing data from/to the memory cell 5. The supply voltage Vcc is also supplied to the memory controlling means.

Figure 1A:
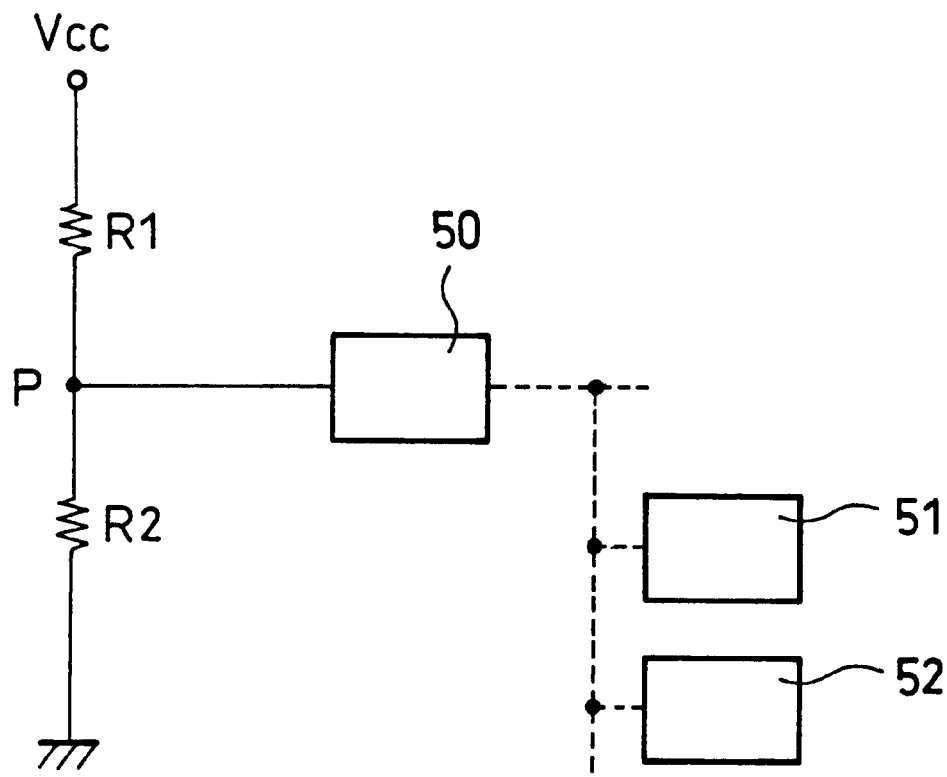
FIG. 1 is a schematic diagram of a low-voltage lockout mechanism for use with a nonvolatile semiconductor memory, particularly, FIG. 1(a) showing in block diagram the construction of the lockout mechanism, and FIG. 1(b) showing voltage levels that affect the nonvolatile memory.
Figure 1B:
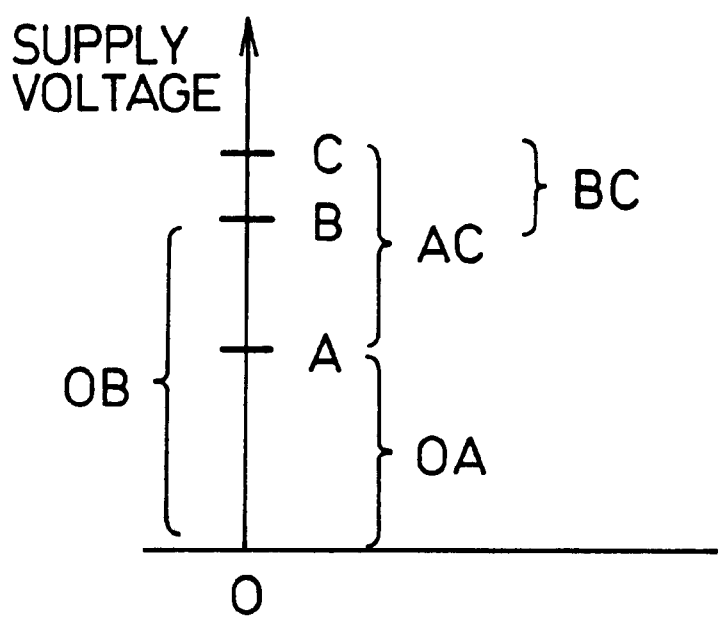
Figure 2:
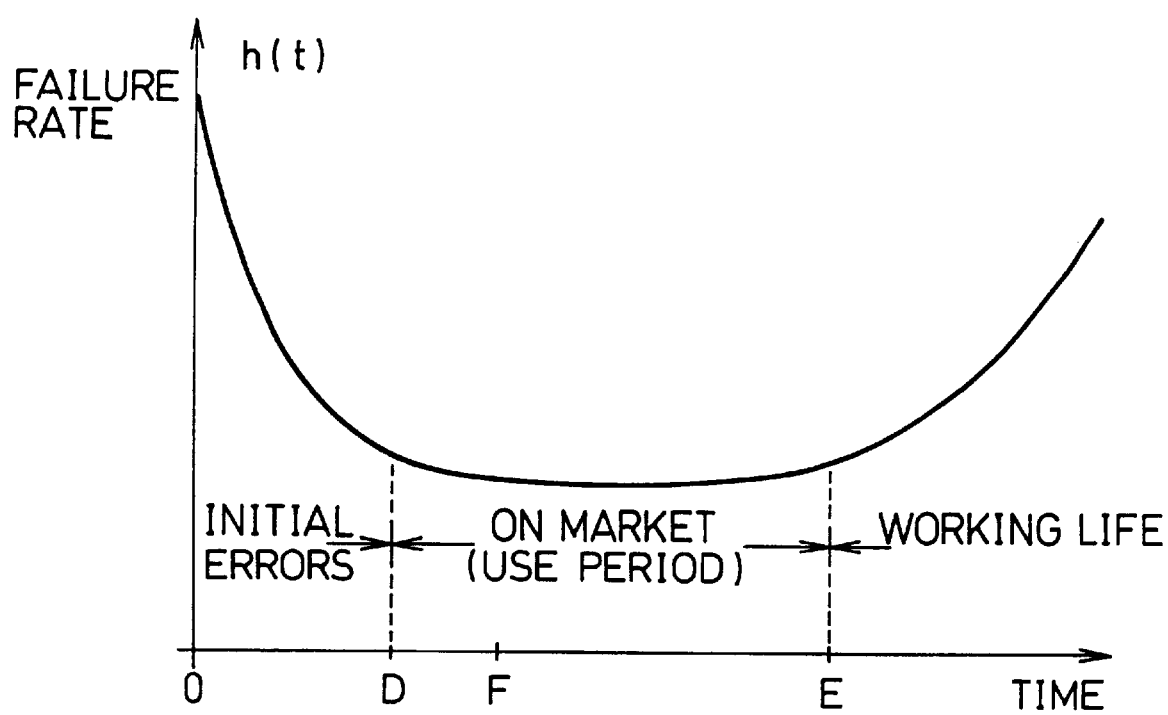
FIG. 2 depicts a relationship between the failure rate and screening time for a ferroelectric memory.

Connected with the terminal 6 is a voltage detection circuit as described in conjunction with FIG. 1, for monitoring the level of the supply voltage Vcc. In response to the output of the voltage detection circuit indicating that the supply voltage is too low, a low-voltage lockout operation will be executed on the memory controlling means (e.g. logic circuits and address controlling circuit) as described above.

The voltage selection means 2 includes an NMOS transistor 21 and a PMOS transistor 22 connected in series with the NMOS transistor 21.

The supply voltage Vcc supplied via the voltage supply terminal 6 is coupled to a node between the NMOS and the PMOS transistors. Connected to the opposite ends of the series transistors 21 and 22 are a voltage dropping means 1 and a nominal (i.e. non-dropping) voltage line 3, respectively, as shown in FIG. 3. The opposite ends of the voltage dropping means 1 and the nominal voltage line 3 are also connected together and further connected with a driving circuit 4.

The nominal voltage line 3 is formed of a line having a small resistance. The gates of the NMOS transistor 21 and the PMOS transistor 22 are connected together to a common internal voltage controller 23. The internal voltage controller 23 has a terminal connected to an external signal source to receive therefrom a high/low signal, which signal causes the supply voltage to be passed through either the voltage dropping means 1 or the nominal voltage line 3.

That is, if the internal voltage controller 23 provides a signal HIGH, this signal turns on the NMOS transistor 21 but turns off the PMOS transistor 22. In this case, the voltage supply terminal 6 is connected to the voltage dropping means 1. On the other hand, if the internal voltage controller 23 provides a signal LOW, it turns off the NMOS transistor 21 and turns on the PMOS transistor 22. Consequently, the voltage supply terminal 6 is connected to the nominal voltage line 3.

The voltage dropping means 1 shown in FIG. 3 consists of three NMOS transistors 11, 12, and 13 connected in series. Each of these NMOS transistors 11, 12, and 13 has a so-called diode connected configuration, in which the gate and the drain thereof are connected with each other.

In general, in order to make an NMOS transistor conductive, it is necessary to impress on it a threshold voltage Vth. However, the threshold voltage Vth may be controlled arbitrarily by adjusting the concentration of impurities doped in the channel region of the NMOS transistor. Thus, the threshold voltage Vth may be dropped by 0.6 Volts for example. Such threshold voltage Vth exists in a diode-connected NMOS transistor.

In the series transistors, their overall voltage drop will be greater than the sum of their threshold voltages, due to the effect of a substrate bias. However, the overall voltage drop is roughly proportional to the number of the transistors in the series. As a result, although an adjustment of the voltage drop is needed in certain cases, the total voltage drop across the voltage dropping means may be determined mainly by the number of the series transistors. In the example shown in FIG. 3, the total voltage drop of 2.4 Volts results. This arises from the threshold voltages Vth of the three NMOS transistors 11, 12, and 13 in the voltage dropping means 1 and one NMOS transistor 21 plus the effect of a substrate bias.

A drive circuit 4 has connections coupled to a word line, a bit line (i.e. data line) and a plate line (i.e. electrode of the ferroelectric capacitor) of each memory cell, so that the circuit 4 may provide either the dropped voltage or the nominal voltage to the memory cell located at the address decoded by a address decoder 43.

In the example shown in FIG. 3, the voltage selection means 2 is disposed adjacent the voltage supply terminal 6, so that the supply voltage Vcc is supplied to the drive circuit 4 through the nominal voltage line 3 or through the voltage dropping means 1. It would be apparent to those skilled in the art that the voltage selection means 2 and the voltage dropping means 1 could be interchanged in position.

If they are so interchanged, the supply voltage Vcc supplied via the voltage supply terminal 6 is first supplied to the voltage dropping means 1 and the nominal voltage line 3. The voltage selection means 2 then selects one of the voltages output from the voltage dropping means 1 and the nominal voltage line 3, and supplies the selected voltage to the drive circuit 4. Thus, the interchange of the voltage dropping means 1 and the voltage selection means 2 merely reverses their relative positions in the circuit, keeping their roles unchanged, so that the structure of the interchanged circuit can be represented by a diagram similar to FIG. 3.

A nonvolatile semiconductor memory of the invention operates as follows. When screening memories of the invention, a HIGH signal is supplied to the internal voltage controller 23 to cause the voltage selection means 2 to connect the voltage supply terminal 6 to the voltage dropping means 1. The voltage dropping means 1 provides a voltage drop which exceeds the sum of each voltage drop across each NMOS transistor in the voltage dropping means 1, as described above. Thus, if there are four NMOS transistors connected for example, the voltage supplied by the voltage dropping means 1 to the drive circuit 4 via the voltage dropping means 1 will be Vcc–(4 Vth+α), where α is a voltage drop due to the effect of a substrate bias.

Because the dropped voltage is set close to the lower limit of the operating voltage of the memory cell 5, the memory cell 5 is still operable, and the screening can be performed yet.

For a ferroelectric memory, potentially defective memory cells will manifest themselves in the screening at such low voltage, so that the screening is substantially equivalent to the screening performed at a high screening voltage over a long period of time. It should be appreciated that in the screening at such lower screening voltage derived from the supply voltage Vcc, the screening is advantageously effected in a short period of time without damaging the memory cell.

Under a normal operating condition, the NMOS transistor 21 of the voltage selection means 2 is turned off and PMOS transistor 22 is turned on, so that the supply voltage Vcc is coupled to the nominal voltage line 3. As a result, the supply voltage Vcc is applied directly to the memory cell 5 through the drive circuit 4.

Screening conditions and normal operating conditions may be summarized as follows.

|  | NMOS 21 | PMOS 22 | Supply Voltage |
| --- | --- | --- | --- |
| During screening | ON | OFF | Vcc – (4 Vth + α) |
| Under Normal Operation | OFF | ON | Vcc |

Because the memory has dedicated voltage dropping means for dropping the supply voltage Vcc and is capable of selectively providing Vcc or the dropped voltage to the memory cell 5 under the control of the internal voltage controller 23, screening may be carried out with the dropped voltage impressed on the memory cell 5 without being bothered by a low-voltage lockout mechanism. In addition, the memory can be put on the market as a very reliable product, since it can be shipped with a low-voltage lockout mechanism installed.

It is noted that a nonvolatile semiconductor memory of the invention may be operated at a lower voltage than a nominal operating voltage even during the working life period by simply switching the voltage selection means 2 so as to provide only the memory cell 5 with the lower voltage as needed, which helps protect the memory and extend its life.

What I claim is:

1. A nonvolatile semiconductor memory comprising:
   a supply voltage terminal for receiving a supply voltage from an external source;

a multiplicity of memory cells;

voltage selection means coupled to said terminal for selectively outputting a first and a second voltage to be supplied to said memory cells; and voltage dropping means coupled between said voltage selection means and said memory cells for dropping said second voltage output from said voltage selection means before it is input to said memory cells.

2. The nonvolatile semiconductor memory according to claims 1, wherein said voltage selection means is controlled by an external control signal.

3. The nonvolatile semiconductor memory according to claim 2, wherein said voltage selection means is adapted to output said first and second voltage via a p-channel transistor and an n-channel transistor, respectively, and generates a control voltage for controlling said transistors.

4. The nonvolatile semiconductor memory according to claim 2, wherein said voltage dropping means comprises one n-channel transistor/diode.

5. The nonvolatile semiconductor memory according to claim 2, wherein said voltage dropping means comprises a multiplicity of n-channel transistors/diodes connected in series.

6. The nonvolatile semiconductor memory according to claim 1, Wherein said voltage selection means is adapted to output said first and second voltage via a p-channel transistor and an n-channel transistor, respectively, and generates a control voltage for controlling said transistors.

7. The nonvolatile semiconductor memory according to claim 1, wherein said voltage dropping means comprises one n-channel transistor/diode.

8. The nonvolatile semiconductor memory according to claim 1, wherein said voltage dropping means comprises a multiplicity of n-channel transistors/diodes connected in series.

9. The nonvolatile semiconductor memory according to claim 1 further comprising, memory controlling means for controlling said memory cells.

10. A nonvolatile semiconductor memory comprising:

a supply voltage terminal for receiving a supply voltage;

a multiplicity of memory cells;

voltage dropping means coupled to said terminal for dropping said supply voltage to a predetermined voltage; and voltage selection means coupled to said voltage dropping means and said terminal for selecting either said predetermined voltage or said supply voltage to be provided to said memory cells.

11. The nonvolatile semiconductor memory according to claim 10, wherein said voltage selection means is controlled by an external control signal.

12. The nonvolatile semiconductor memory according to claim 11, wherein said voltage selection means is adapted to selectively output said predetermined or supply voltage via an n-channel transistor and a p-channel transistor, respectively, and generates a control voltage for controlling said transistors.

13. The nonvolatile semiconductor memory according to claim 11, wherein said voltage dropping means comprises one n-channel transistor/diode.

14. The nonvolatile semiconductor memory according to claim 11, wherein said voltage dropping means comprises a multiplicity of n-channel transistors/diodes connected in series.

15. The nonvolatile semiconductor memory according to claim 10, wherein said voltage selection means is adapted to selectively output said predetermined or supply voltage via an n-channel transistor and a p-channel transistor, respectively, and generates a control voltage for controlling said transistors.

16. The nonvolatile semiconductor memory according to claim 10, wherein said voltage dropping means comprises one n-channel transistor/diode.

17. The nonvolatile semiconductor memory according to claim 10, wherein said voltage dropping means comprises a multiplicity of n-channel transistors/diodes connected in series.

18. The nonvolatile semiconductor memory according to claim 10 further comprising, memory controlling means for controlling said memory cells.

19. A nonvolatile semiconductor memory comprising:

at least one memory cell;

an internal voltage controller coupled to at least one voltage controller transistor wherein said internal voltage controller controls said at least one voltage controller transistor for selectively outputting a voltage to be supplied to said at least one memory cell; and at least two series-connected transistors coupled between said at least one voltage controller transistor and said at least one memory cell for dropping said voltage output from said at least one voltage controller transistor before it is input to said at least one memory cell.

20. The nonvolatile semiconductor memory according to claim 19, wherein said internal voltage controller is controlled by an external control signal.

21. The nonvolatile semiconductor memory according to claim 19, wherein said at least one voltage controller transistor comprises at least one p-channel transistor and at least one n-channel transistor, and said internal voltage controller generates a control voltage for controlling said at least one voltage controller transistor.

22. The nonvolatile semiconductor memory according to claim 19, wherein said at least two series-connected transistors comprise n-channel transistors.

23. A nonvolatile semiconductor memory comprising:

a supply voltage terminal for receiving a supply voltage;

at least one memory cell;

at least two series-connected transistors for dropping said supply voltage before it is input to said at least one memory cell, said at least two series-connected transistors coupled between said supply voltage terminal and said at least one memory cell; and at least one voltage controller transistor wherein each of said at least one voltage controller transistor is coupled between an internal voltage controller and one of said supply voltage terminal and said at least two series-connected transistors, wherein said internal voltage controller controls said at least one voltage controller transistor for selectively outputting a voltage to be supplied to said at least one memory cell.

24. The nonvolatile semiconductor memory according to claim 23, wherein said internal voltage controller is controlled by an external control signal.

25. The nonvolatile semiconductor memory according to claim 23, wherein said at least one voltage controller transistor comprises at least one p-channel transistor and at least one n-channel transistor, and said internal voltage controller generates a control voltage for controlling said at least one voltage controller transistor.

26. The nonvolatile semiconductor memory according to claim 23, wherein said at least two series-connected transistors comprise n-channel transistors.

* * * * *